(12) United States Patent
Lewin et al.

(10) Patent No.: US 7,359,745 B2
(45) Date of Patent: Apr. 15, 2008

(54) METHOD TO CORRECT MAGNETIC FIELD/PHASE VARIATIONS IN PROTON RESONANCE FREQUENCY SHIFT THERMOMETRY IN MAGNETIC RESONANCE IMAGING

(75) Inventors: Jonathan S. Lewin, Beachwood, OH (US); Jeffrey L. Duerk, Avon Lake, OH (US); Kestutis J. Barkauskas, Cleveland Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 799 days.

(21) Appl. No.: 10/437,662

(22) Filed: May 14, 2003

(65) Prior Publication Data
US 2004/0041563 A1 Mar. 4, 2004

Related U.S. Application Data

(60) Provisional application No. 60/380,720, filed on May 15, 2002.

(51) Int. Cl.
*A61B 5/05* (2006.01)
(52) U.S. Cl. ............. 600/410; 600/412; 324/312; 324/315; 324/318
(58) Field of Classification Search ............ 324/318, 324/320; 128/653.2; 600/407–423
See application file for complete search history.

(56) References Cited

U.S. PATENT DOCUMENTS 5,157,330 A * 10/1992 Kaufman et al. ......... 324/320
5,711,300 A * 1/1998 Schneider et al. ........ 600/412
6,064,206 A 5/2000 Van Vaals et al.
6,377,834 B1 * 4/2002 Zhou et al. ............... 600/412

FOREIGN PATENT DOCUMENTS

EP   0 337 588 A   10/1989
EP   1 058 123 A   12/2000

OTHER PUBLICATIONS

Axel L., et al.: correction of Phase Wrapping in Magnet Resonance Immaging:: Medical Physics, American Institute of Physics, New York, US, vol. 16, No. 2, Mar. 1, 1989, pp. 284-287, XP000047864; ISSN: 0094-2405; p. 284, section "Materials and Methods"—p. 286, right-column, line 6.
Barkauskas, et al., Accurate Reconstruction of Thermal Profiles in Proton Resonance Frequency (PRF) Shift MR Thermometry at 0.2T, 1pg, undated.
Barkauskas, et al., Variation Correction Algorithm: Analysis of Phase Suppression and Thermal Profile Fidelity for PRF MR Thermometry at 0.2T, 2 pgs, undated.
Barkauskas, et al., Correcting Sources of Background Phase Variations for Accurate Reconstruction . . . , 1 pg, undated.

(Continued)

*Primary Examiner*—Brian L. Casler
*Assistant Examiner*—John F. Ramirez

(57) ABSTRACT

PRF shift MRI data is acquired. The PRF shift MRI data may include signals affected by both a desired PRF shift and an undesired PRF shift. Thus, example systems and methods describe manipulating the PRF shift MR! data to make it substantially free of the effects of the undesired PRF shift, which facilitates displaying certain MRI images based on the desired PRF shift.

8 Claims, 11 Drawing Sheets

OTHER PUBLICATIONS

Barkauskas, et al., PRF Shift Thermometry at 0.2T: Quantitative Evaluation of Suppression and Thermal profile Errors . . . , 1 pg, undated.

Barkauskas, et al., "PRF Shift Thermometry at 0.2T: A new Background Phase Variation Suppression Scheme and Its Impact on Thermal Lesion Fidelity" Proc. Intl. Soc. Mag. Reson. Med 9 (2001), nodate.

Barkauskas, et al., "Variation Correction Algorithm: Analysis of Phase Suppression and Thermal Profile Fidelity for PRF MR Thermometry at 0.2T" Journal of Magnetic Resonance Imaging 17:227-240 (2003), no date.

Wong, et al., "Optical Detuning of Parallel-Resonance Circuits in High Field Systems: Initial Experiences" Proc. Intl. Soc. Mag. Reson. Med 9 (2001).

* cited by examiner

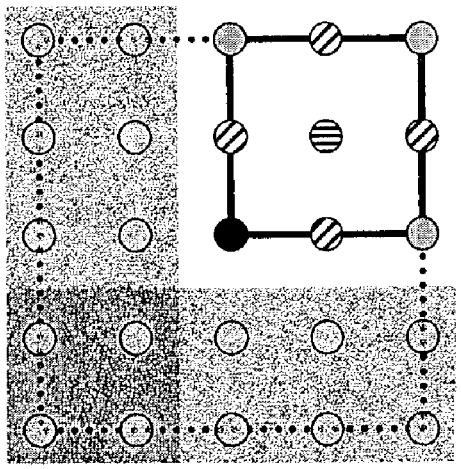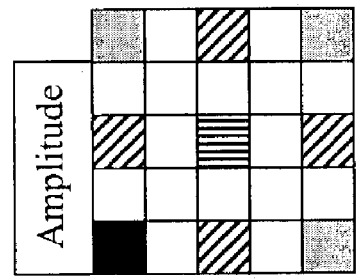
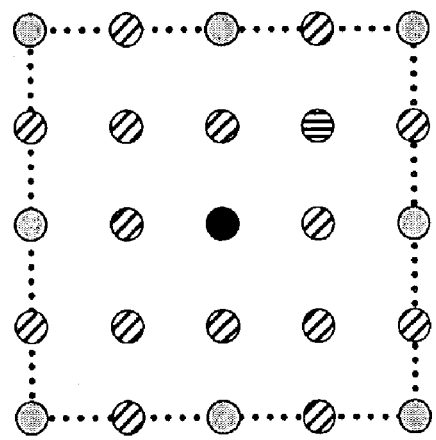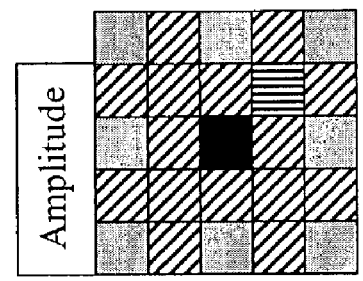
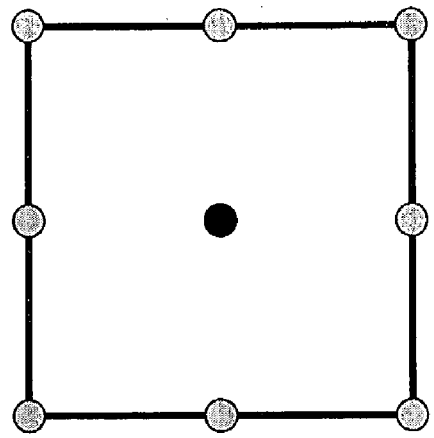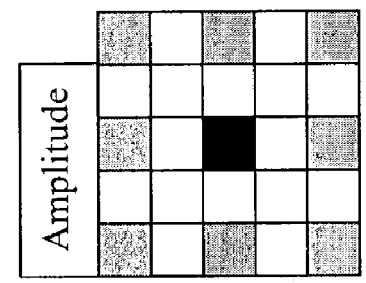
Fig. 11

METHOD TO CORRECT MAGNETIC FIELD/PHASE VARIATIONS IN PROTON RESONANCE FREQUENCY SHIFT THERMOMETRY IN MAGNETIC RESONANCE IMAGING

CROSS REFERENCE TO RELATED APPLICATIONS

This application claims the benefit of U.S. Provisional Application No. 60/380,720 titled "PRF Shift Thermometry in MRI System", filed May 15, 2002, which is incorporated herein by reference.

TECHNICAL FIELD

This application relates to the magnetic resonance imaging (MRI) arts. It finds particular application to improving the fidelity of images based on proton resonance frequency (PRF) shifting that are affected by both desired and undesired phase shifting events. Although a magnetic resonance imaging system is described herein, the method may be applicable to MRI, NMR and/or other applications that experience phase variations.

BACKGROUND

MRI systems acquire diagnostic images without relying on ionizing radiation. Instead, MRI employs strong, static magnetic fields, radio-frequency (RF) pulses of energy, and time varying magnetic field gradient waveforms. Unfortunately, the strong, static magnetic fields may sometimes experience temporal, spatial, field strength, and/or other variations, which may impact imaging applications that rely on proton resonant frequency shifting and/or other applications (e.g., velocity measurement) using phase shifting.

MRI is a non-invasive procedure that employs nuclear magnetization and radio waves to produce internal pictures of a subject. Two or three-dimensional diagnostic image data is acquired for respective "slices" of a subject area. These data slices typically provide structural detail having, for example, a resolution of one millimeter or better. Programmed steps for collecting data, which is used to generate the slices of the diagnostic image, are known as an MR image pulse sequence. The MR image pulse sequence includes generating magnetic field gradient waveforms applied along up to three axes, and one or more RF pulses of energy. The set of gradient waveforms and RF pulses are repeated a number of times to collect sufficient data to reconstruct the image slices.

Data is acquired during successive repetitions of an MR imaging pulse sequence or excitation. Ideally, there is little or no variation in the nuclear magnetization and the spatio-temporal characteristics of the background magnetic field during the respective excitations. However, variations can occur. When variations occur, data used to create an image between respective excitations may have peak signal locations that become misaligned. Thus, the nuclear magnetization variations may degrade the quality of the MR data used to produce the images, particularly in PRF shift applications.

Sources of background phase variation can dominate the features of phase images used to generate temperature difference maps in PRF MR thermometry. This is particularly problematic at low magnetic field strengths (e.g., 0.2T resistive magnets). These errors exist, albeit to a lesser extent, when performed on higher field and/or superconducting systems.

SUMMARY

The following presents a simplified summary of methods, systems, application programming interfaces (API), and computer readable media employed with PRF shift imaging (e.g., thermometry) in an MRI system, to facilitate providing a basic understanding of these items. This summary is not an extensive overview and is not intended to identify key or critical elements of the methods, systems, computer readable media, and so on or to delineate the scope of these items. This summary provides a conceptual introduction in a simplified form as a prelude to the more detailed description that is presented later.

An example system acquires a reference MRI data, then acquires subsequent MRI data to compare to the reference MRI data. For example, temperature variations can be related to proton resonant frequency variation. This allows temperature changes to be measured with MRI through signal frequency variation and thus phase variation over time. The example system analyzes and then manipulates input data that may be affected by undesired phase shifting events (e.g., magnetic field variation in space and/or time) to facilitate mitigating the effects of the undesired phase shifting events. The example system then analyzes and manipulates the processed input data to study (e.g. identify, quantify) phase shifts related to desired phase shifting events (e.g., heating a portion of an object to be imaged).

In one example, some or all of the components of the example systems and methods may be implemented as software executable by one or more computers or other processing devices. They may be embodied in a computer readable medium like a magnetic disk, digital compact disk, electronic memory, persistent and/or temporary memories, and so on as known in the art. They may also be embodied as hardware or a combination of hardware and software.

Certain illustrative example methods, systems, APIs, and computer readable media are described herein in connection with the following description and the annexed drawings. These examples are indicative, however, of but a few of the various ways in which the principles of the methods, systems, APIs, and computer readable media may be employed and thus are intended to be inclusive of equivalents. Other advantages and novel features may become apparent from the following detailed description when considered in conjunction with the drawings.

BRIEF DESCRIPTION OF THE DRAWINGS

FIG. 11 illustrates example indirect interpolation.

DETAILED DESCRIPTION

Figure 1:
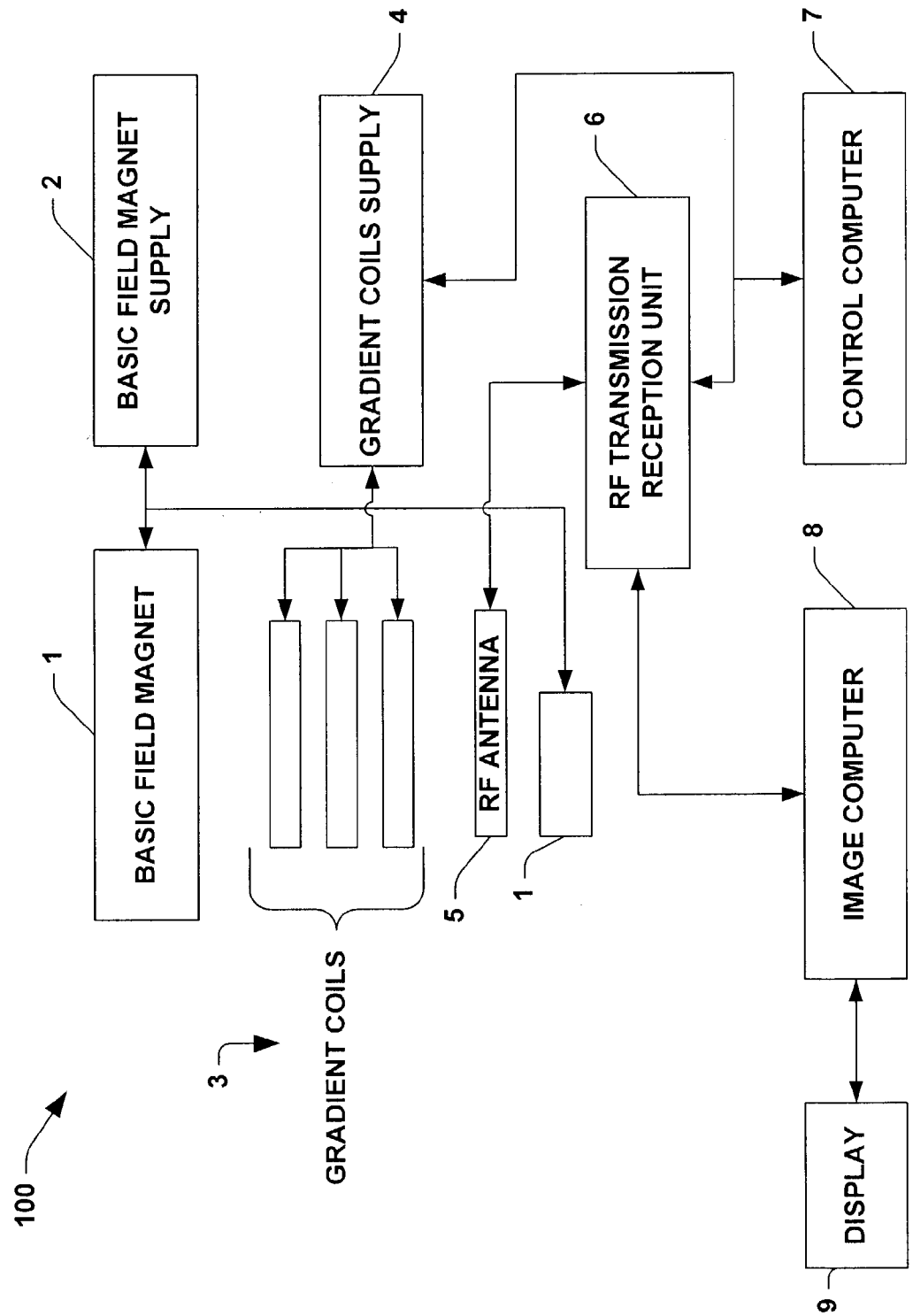
FIG. 1 illustrates an example MRI system.

Example methods, systems, APIs, and computer media are now described with reference to the drawings where like reference numerals are used to refer to like elements throughout. In the following description, for purposes of explanation, numerous specific details are set forth to explain the methods, systems, APIs, and computer readable media. It may be evident, however, that the methods, systems, APIs, and computer readable media can be practiced without these specific details. In other instances, well-known structures and devices are shown in block diagram form in order to simplify description.

As used in this application, the term "computer component" refers to a computer-related entity, either hardware, firmware, software, a combination thereof, or software in execution. For example, a computer component can be, but is not limited to being, a process running on a processor, a processor, an object, an executable, a thread of execution, a program, and a computer. By way of illustration, both an application running on a server and the server can be computer components. One or more computer components can reside within a process and/or thread of execution and a computer component can be localized on one computer and/or distributed between two or more computers.

"Software", as used herein, includes but is not limited to one or more computer readable and/or executable instructions that cause a computer or other electronic device to perform functions, actions, and/or behave in a desired manner. The instructions may be embodied in various forms like routines, algorithms, modules or programs including separate applications or code from dynamically linked libraries. Software may also be implemented in various forms like a stand-alone program, a function call, a servelet, an applet, instructions stored in a memory, part of an operating system or other type of executable instructions. It will be appreciated by one of ordinary skill in the art that the form of software is dependent on, for example, requirements of a desired application, the environment in which it runs, and/or the desires of a designer/programmer or the like.

"Logic", as used herein, includes but is not limited to hardware, firmware, software and/or combinations of each to perform a function(s) or an action(s). For example, based on a desired application or needs, logic may include a software controlled microprocessor, discrete logic such as an application specific integrated circuit (ASIC), or other programmed logic device. Logic may also be fully embodied as software.

"Computer communication", as used herein, refers to a communication between two or more computers and/or computer components and can be, for example, a network transfer, a file transfer, an applet transfer, an email, a hypertext transfer protocol (HTTP) message, a datagram, an object transfer, a binary large object (BLOB) transfer, and so on. A computer communication can occur across, for example, a wireless system (e.g., IEEE 802.11), an Ethernet system (e.g., IEEE 802.3), a token ring system (e.g., IEEE 802.5), a local area network (LAN), a wide area network (WAN), a point-to-point system, a circuit switching system, a packet switching system, and so on.

An "operable connection" (or a connection by which entities are "operably connected") is one in which signals and/or actual communication flow and/or logical communication flow may be sent and/or received. Usually, an operable connection includes a physical interface, an electrical interface, and/or a data interface, but it is to be noted that an operable connection may consist of differing combinations of these or other types of connections sufficient to allow operable control.

"Data store", as used herein, refers to a physical and/or logical entity that can store data. A data store may be, for example, a database, a table, a file, a list, a queue, a heap, and so on. A data store may reside in one logical and/or physical entity and/or may be distributed between two or more logical and/or physical entities.

It will be appreciated that some or all of the processes and methods of the system involve electronic and/or software applications that may be dynamic and flexible processes so that they may be performed in other sequences different than those described herein. It will also be appreciated by one of ordinary skill in the art that elements embodied as software may be implemented using various programming approaches such as machine language, procedural, object oriented, and/or artificial intelligence techniques.

The processing, analyses, and/or other functions described herein may also be implemented by functionally equivalent circuits like a digital signal processor circuit, software controlled microprocessor, an application specific integrated circuit and the like. Components implemented as software are not limited to any particular programming language. Rather, the description herein provides the information one skilled in the art may use to fabricate circuits or to generate computer software to perform the processing of the system. It will be appreciated that some or all of the functions and/or behaviors of the present system and method may be implemented as logic as defined above.

FIG. 1 illustrates an example MRI system 100 that may be used with the example systems and methods described herein and equivalents. Of course, other types of MRI systems can be used and other system configurations are anticipated. The system 100 includes a basic field magnet 1 and a basic field magnet supply 2. The system 100 has gradient coils 3 for respectively emitting gradient magnetic fields $G_S$, $G_P$ and $G_R$ operated by a gradient coil supply 4. An RF antenna 5 is provided for generating the RF pulses, and for receiving the resulting magnetic resonance signals from an object being imaged. While a single RF antenna 5 is illustrated, it is to be appreciated that there may be two or more RF antennae that send/receive and/or that are dedicated to either sending or receiving.

The RF antenna 5 is operated by an RF transmission/reception unit 6. The gradient coil supply 4 and the RF transmission/reception unit 6 are operated by a control computer 7 to produce radio frequency pulses that are directed to the object to be imaged. The RF antenna 5 receives or otherwise detects the magnetic resonance signals from the object. The detected signals are subject to a transformation process like a Fourier Transform (FT) or a fast Fourier Transform (FFT), which generates pixelated image data. The transformation may be performed by an image computer 8 or other similar processing device and/or computer component. The image data may then be shown on a display 9. The object to be imaged typically is positioned on a table, couch or other type of support that can be selectively moved during a scan along an imaging area or bore of the MR apparatus.

An MRI system like system 100 can be employed, for example, in PRF shift thermometry. An example system can accurately monitor temperature changes in the body during interstitial and/or percutaneous interstitial methods of thermal energy delivery, for example, using a variety of techniques including, but not limited to, laser, RF, and focused ultrasound. PRF shift thermometry may also be applied in applications where tissue is heated for gene therapy delivery based on liposomes or the like. The example systems and methods described herein can, in one example, determine the development of a temperature profile in a given volume of tissue/sample with MR in the presence of temporal variations in the magnetic field. For example, $B_0$ of a resistive magnet tends to drift as a function of room temperature and it may be desirable to minimize or cancel the effects of the drift.

While temperature related applications are described herein, other applications including, but not limited to, velocity imaging (e.g., measuring blood flow quantitatively), elastography, measuring or determining derivatives of motion (e.g., velocity, acceleration) and so on can benefit from the processing performed by the example systems and methods described herein. The methods are related to physical parameters that can be encoded in the phase of an NMR/MRI signal.

In PRF MR thermometry and other similar applications, temporal instability of the magnetic field $B_0$ and misalignment of echoes in the raw data prior to reconstruction contribute to background phase variations that complicate extracting an accurate temperature profile. A phase correction scheme referred to as a Variation Correction Algorithm (VCA) combines accurate alignment of echoes in data space (a.k.a. k-space), k-space based phase correction, and extracting wrap free phase differences on a pixel-by-pixel basis to mitigate the effects of, for example, $B_0$ variations.

One example PRF application depends on the physics of protons, where they behave differently at different temperatures. For example, temperature changes lead to a shift of the 1H proton resonance frequency of water by $\delta=-00.1$ ppm/° C. (e.g., the PRF method). Using a gradient-recalled echo (GRE) sequence, PRF shift MR thermometry takes advantage of the tissue-type independence of $\delta$ and reconstructs a relative temperature map, $\Delta T$, from a phase difference image, $\Delta\phi$, via: $\Delta\phi(x,y,z,t)=\gamma \cdot B_0(x,y,z,t) \cdot \delta \cdot TE_{eff} \cdot \Delta T(x,y,z,t)$. Here $\gamma=2\pi \cdot 42.58$ MHz/T, $B_0$ is the main magnetic field, and $TE_{eff}$ is the effective echo time. In practice, temporal instability of $B_0$ and misalignment of echoes contribute to low-order, time dependent background phase variations (via Fourier transform properties) to the image. This hinders extracting an accurate temperature profile and hinders future clinical applications of MR thermometry toward quantitative thermal dose/tissue death relationships.

If $B_0$ variations did not occur, then performing PRF shift thermometry might be as simple as gathering a magnetic resonance image k-space data, performing a Fourier transform reconstruction that produces a real image component, $R(x,y)$ and an imaginary image component, $I(x,y)$, determining a phase angle from the ratio of the imaginary and real components of the image by using, for example, trigonometry, and repeatedly performing the calculations as an item is heated.

For example, a method to measure temperature change from an MR image of an object would include acquiring a base line complex (e.g., real and imaginary) image before heating the object, examining the phase angle at every position in the image and establishing a reference image, heating the object and determining how much the phase angle changes at each location in the image by finding the difference between corresponding values in the current image (heated image) and the reference image, and calculating how much the temperature has changed.

However, the systems and methods described herein are not so simple since the main magnetic field $B_0$ is not a constant in time or space, which may cause inaccuracies in the measurements. For example, using the above described simple process for calculating the phase difference between two images, if the main magnetic field changed between the two acquisitions, then the phase angle would change independent of temperature simply because of the field $B_0$ changing. Similarly, if the homogeneity of the magnet changed (e.g., a spatial variation in the background field), this would give rise to an undesired phase shifting effect.

Thus, the example systems and methods described herein include logic for collecting data in an MR acquisition and using properties of k-space, Fourier transforms and interpolation schemes to calculate and determine a temperature change (or other local phase change) in a MR image in the presence of temporally and/or spatially dependent variations in the background magnetic field (e.g. the main magnetic field).

Figure 2:
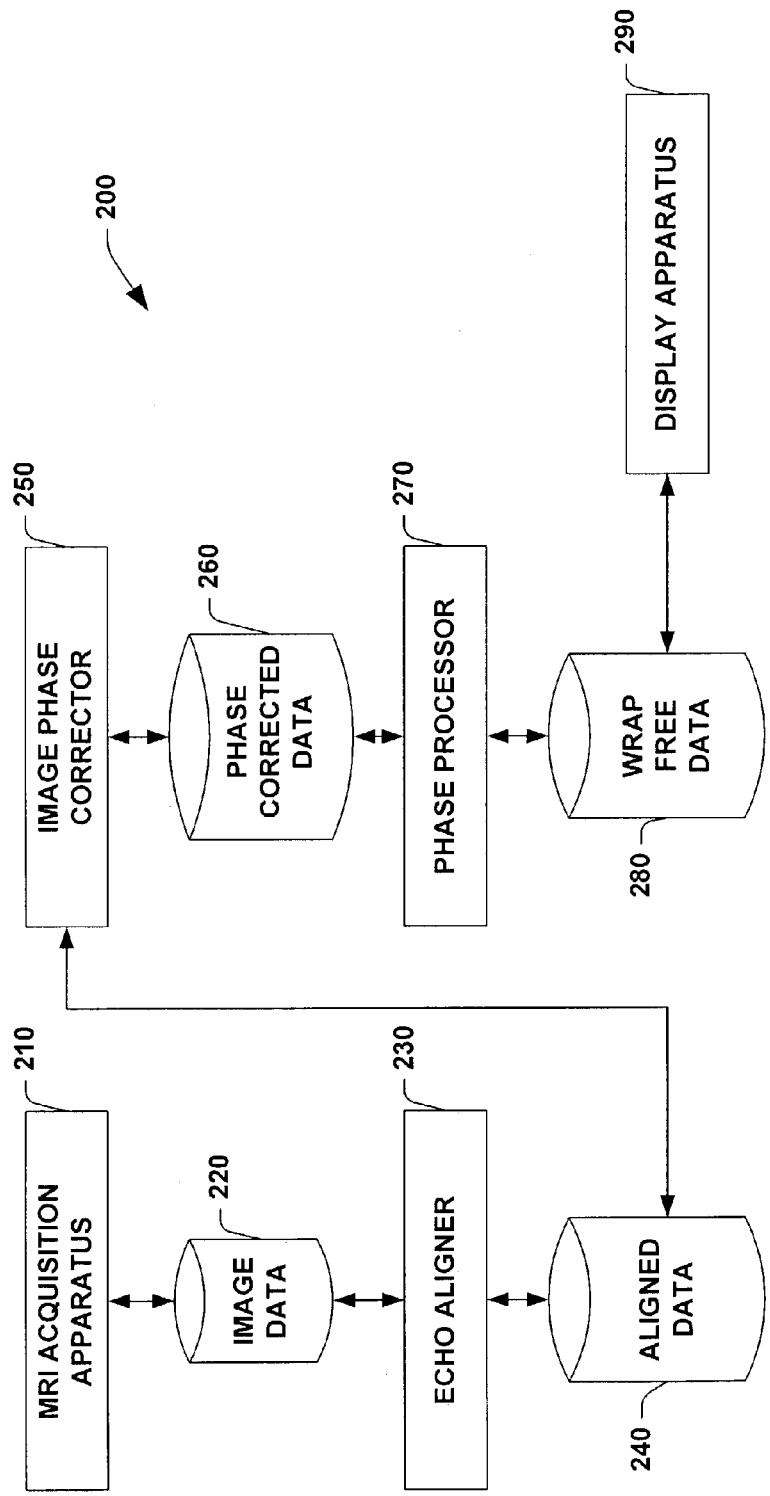
FIG. 2 illustrates an example system for mitigating the effects of undesired phase shifting events.

Thus, turning to FIG. 2, an example correcting system 200 for correcting $B_0$ background phase variations to facilitate accurately reconstructing thermal profiles in PRF shift MR thermometry is illustrated. In one example, the correcting system 200 includes an MRI apparatus 210 that generates a plurality of sets of image data. While the MRI apparatus 210 is illustrated and described as being part of the system 200, it is to be appreciated that a smaller correcting system could receive image data from an MRI apparatus 210 that is external to the correcting system 200.

The MRI acquisition apparatus 210 produces an image data that can be stored, for example, in an image data store 220. The image data may include, for example, a plurality of sets of data, each representing a slice of an object to be imaged. In PRF shift thermometry, each slice would contain temperature information that can be employed to produce a thermal and/or thermal difference image.

Phase differences may exist between images if the maximum acquired signal in portions of an image (e.g. in a set of data) occurs at different locations in the frequency domain, also known as k-space, for different portions (e.g., slices, in different sets of data). The example system 200 analyzes k-space data sets and logic shifts the data so that the peak signals will be aligned with the center of k-space (or some other constant k-space location) to the nearest fraction of a sample. A peak interpolated signal is determined within k-space and then accurately aligned to a consistent k-space location throughout the series of images. Thus, an echo aligner 230 is included to align the plurality of sets of image data with respect to a maximum k-space signal location in each of the sets of image data. The echo aligner 230 can produce an aligned data that can then be stored in a data store 240. The echo aligner 230 also interpolates to the sub sample resolution.

The system 200 also includes an image phase corrector 250. The image phase corrector 250 phase corrects the MRI data employing the phase of a high resolution image of an N×M mask of low-frequency k-space (e.g., Fourier coefficients) coefficients as a phase correction map. In one example, N could be equal to, greater than or less than M, where N and M refer to the respective number of rows and columns of data contained within the mask. The values of N and M could range from zero to the maximum available row and column dimensions of the image. In another example, N is less than five and M is less than five. In another example, N equals M and both are set to three. Depending on the application, the image resolution, FOV, and so on, M and N may take on a variety of values. By way of illustration, when the temperature profile is small relative to the FOV, then N and M are typically small. However, this relation can change depending on the size of the object relative to the FOV, or based on the amount of data acquired. Thus, the image phase corrector 250 corrects background phase variations in the aligned data 240 and forms one or more phase corrected sets of image data that can be stored, for example, in a phase corrected data store 260. Performing k-space based phase correction can include identifying a phase change that is due to an undesired phase changing event (e.g., $B_0$ variation) and then manipulating the aligned data to suppress the phase change. In the case of an overall $B_0$ variation, the phase change effect will be localized near the center of k-space (by Fourier Transform properties) and thus relevant data employed in background suppression can be concentrated there.

The system 200 also includes a phase processor 270. The phase processor 270 determines a wrap free phase change from the reference image on an element-by-element basis. In one example, the element is a pixel that contains phasor data, or the magnitude and phase of the signal stored in that pixel. In one example, an examination of one or more relationships between the real and imaginary components of the data contained within the pixel at two different times leads to the formation of wrap free phase change over the range 0 to $2\pi$. In one example, the different times correspond to an image before (e.g., reference) and an image during heating or some other desired phase shifting event. Thus, the phase processor 270 forms a wrap free phase difference in the phase corrected sets of image data stored in the phase corrected data store 260 and stores the wrap free phase difference data in a wrap free data store 280.

In one example, the system 200 includes a display apparatus 290 that can employed to display an image derived from the wrap free data stored in the wrap free data store 280 and/or other data stores in system 200.

Figure 3:
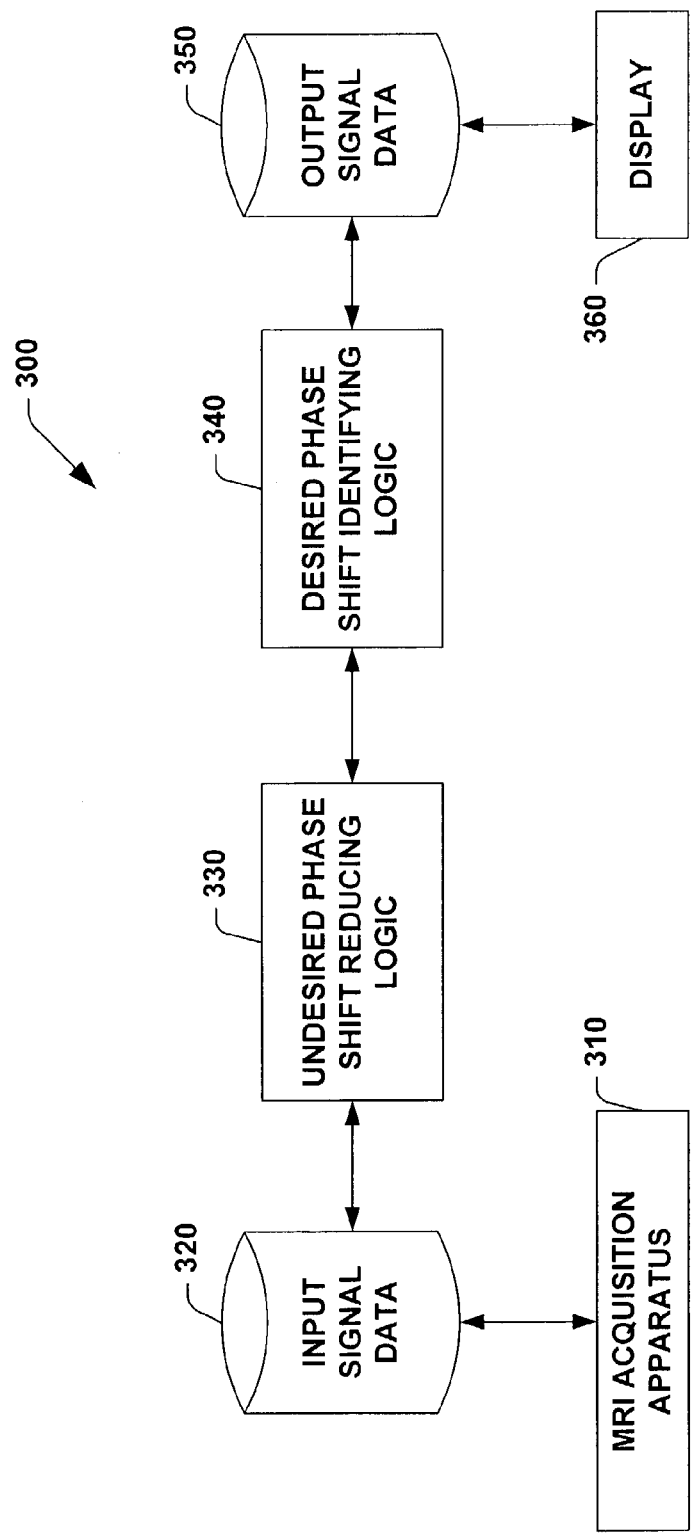
FIG. 3 illustrates an example system for PRF shift thermometry.

Turning now to FIG. 3, a system 300 that facilitates mitigating the effects of undesired phase shifts and quantifying the effects of desired phase shifts is illustrated. The system 300 includes a data store 320 for storing an input signal data received from an MRI system 310. In one example, the MRI system 310 is external to the system 300, in another example, the system 300 is integrated into the MRI system 310. The input signal data may include, for example, two or more related sets of image data taken at two or more different points in time. For example, a first set of image data may be acquired before a portion of an object to be imaged and heated is heated, and one or more second sets of images may be acquired while and/or after the portion of the object is being heated.

The system 360 includes a first logic 330 for processing the input signal data into a processed signal data. The processing attempts to mitigate the effects of one or more undesired phase shifting events on the input signal data. By way of illustration, a component of the input signal may be suppressed in the processed signal data so that it retains a higher signal to noise ratio related to the signal from a desired phase shifting event (e.g., heating).

The system 300 also includes a second logic 340 for processing the processed signal data to quantify the effects of one or more desired phase shifting events. For example, the input signal may have a component related to a desired phase shifting event like heating a region of the object. After the first logic 330 has reduced the component of the input signal attributable to undesired phase shifting events (e.g. $B_0$ variation), then the second logic 340 can focus on the component of the input signal attributable to a desired phase shifting event. While the first logic 330 and the second logic 340 are illustrated and described as separate entities, it is to be appreciated that both logics may be implemented in a single logic, program, and/or computer component, for example.

Undesired phase shifting events can include, but are not limited to a variation in a main magnetic field in the MRI system and a misaligning of echoes in the input signal data. The variations in the main magnetic field can include, but are not limited to, a temporal variation, a spatial variation, and a field strength variation. Desired phase shifting events can include, but are not limited to, heating, a motion change, a velocity change, and an acceleration change.

In one example, the input image data is a set of k-space data that contains a peak k-space signal location. Thus, the first logic 330 can identify the peak k-space signal location for two or more of the related sets of image data to facilitate aligning the related sets of image data. After identifying one or more k-space signal locations, the first logic 330 can then align the two or more related sets of image data. In one example, the first logic 330 employs an indirect interpolation algorithm to identify a peak k-space signal location.

In one example, the second logic 340 establishes a first set of processed signal data as a reference signal to which subsequent sets of data can be compared. Thus, the second logic 340 can compare one or more second sets of processed signal data to the reference signal to create one or more sets of difference data. Since the second logic 340 is producing difference data, the system 300 can include a data store (not illustrated) for storing the reference signal and one or more sets of difference data. An output signal data can then be generated by the second logic 340 and/or an MRI apparatus and stored in an output signal data store 350.

In one example, the system 300 includes a display 360 for displaying an image developed from the reference signal and one or more sets of difference data and/or from the output signal data stored in the output signal data store 350.

The second logic 340 can, in one example, determine one or more phase shifts between one or more elements of the processed signal data according to $\Delta\phi = \phi_{ref} - \phi_2$. Furthermore, the second logic 340 can compute $\phi_{ref}$ and $\phi_2$ according to $\phi = \tan^{-1}(I(x,y)/R(x,y))$.

The first logic 330 can compute a phase shift due to a variation in $B_0$ by processing k-space data centered around and local to the location of the peak k-space signal. As described herein, the effects of phase shifts that affect substantially all the object being imaged will be focused in a small region around one spot in k-space while phase shifts that affect only a portion of the object being imaged will be distributed throughout substantially all of k-space. Thus, the second logic 340 computes a phase shift due to a temperature change retaining the k-space effects of local image phase shifts, (where the desired effects are distributed remotely from the location of the peak k-space signal), and reducing the undesired background shifts, (where the k-space effects of background image phase shifts are concentrated near the location of the peak k-space signal). In one example, the second logic 340 computes a desired phase shift due to temperature change according to:

$$\Delta\phi(x,y,t) = \gamma * B_0(x,y,t) * \delta * TE_{eff} * \Delta T(x,y,t),$$

where $\delta = -0.01$ ppm/C°, and $\gamma = 2\pi * 42.58$ MHz/T. Additionally, the system 300 can have the first logic 330 extract a wrap free phase difference on a pixel by pixel basis from the input signal data.

Figure 4:
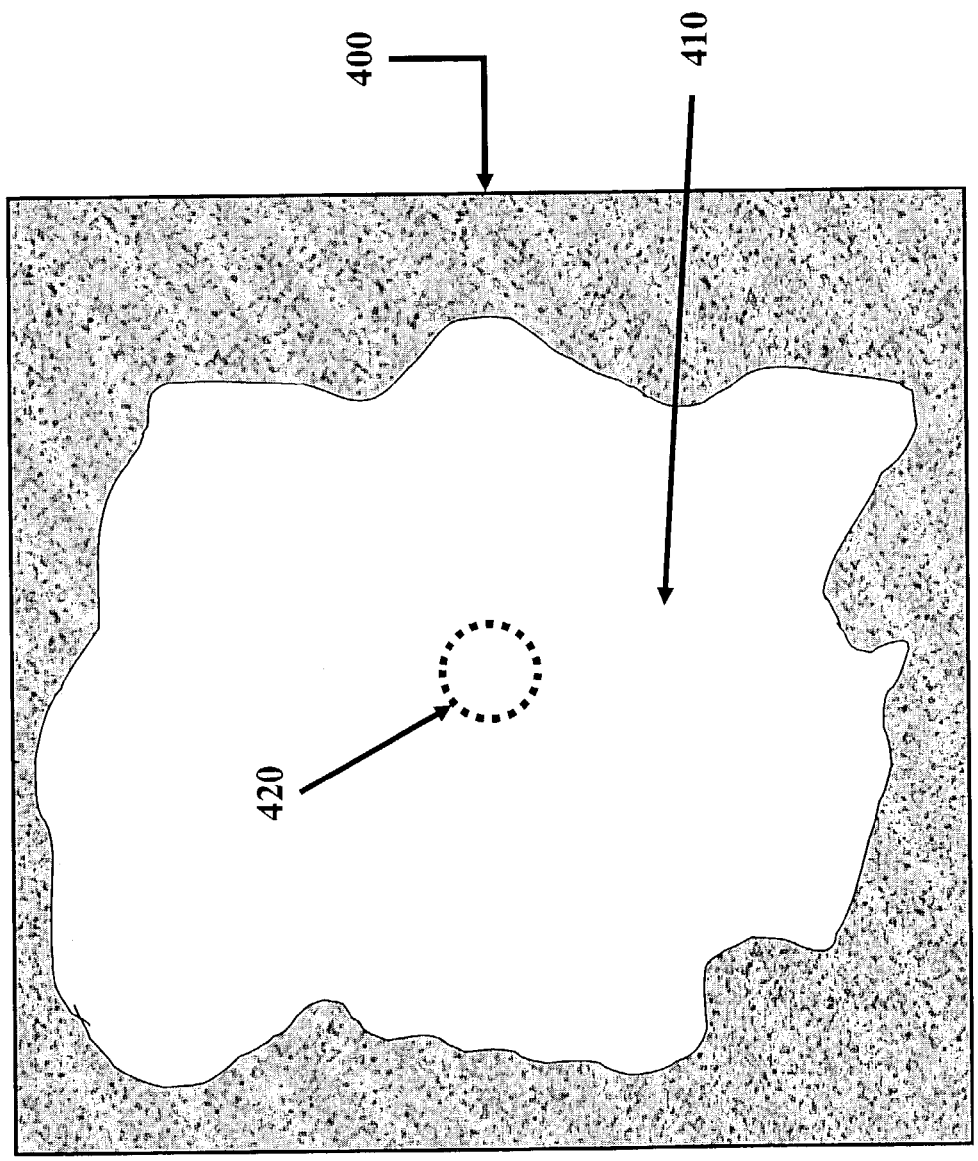
FIG. 4 illustrates an example region of interest in a field of view.

FIG. 4 illustrates an object 410 to be imaged, where a region of interest has been centered in the field of view 400. In the region of interest, an area 420 may be subjected to desired phase shifting events (e.g., heated). Phase shifting events that affect substantially all of the object 410 will have their effects concentrated near a single point (e.g., the center of k-space) in the k-space associated with the low frequency components of the MR data of the object 410. Conversely, phase shifting events that affect only a small area (e.g., area 420) will have their effects distributed substantially throughout all of the k-space associated with the MR data of the object 410.

Figure 5:
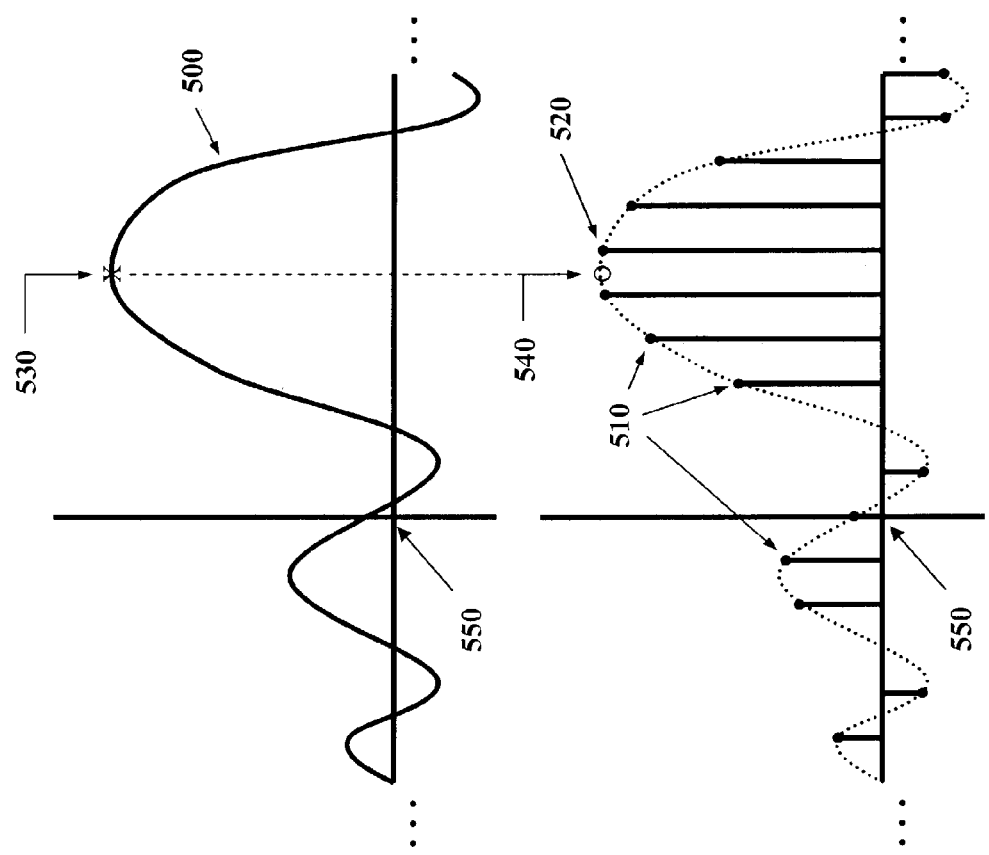
FIG. 5 illustrates an example plot of sampled data points employed in indirect interpolation.

FIG. 5 illustrates an example signal 500 that can be received from an MRI apparatus. As part of the data acquisition, the signal 500 is sampled by the MR apparatus at various time intervals. In one example, the time intervals are uniform while in another example the time intervals are not necessarily uniform. The sampled signal 510 is processed into an image at a later time. In one example, the maximum amplitude 520 of the sampled signal does not correspond to the true maximum amplitude 530 of the signal. Therefore, indirect interpolation is performed to facilitate rapidly locating the position of maximum interpolated amplitude 540, which should correspond to the location of the true maximum amplitude 530 to within a pre-determined, configurable tolerance. The indirect interpolation also facilitates shifting the data set to match the position of maximum interpolated signal amplitude with a pre-determined position in k-space (e.g., center pixel 550). One example indirect interpolation is discussed later, in connection with FIG. 11.

Figure 6:
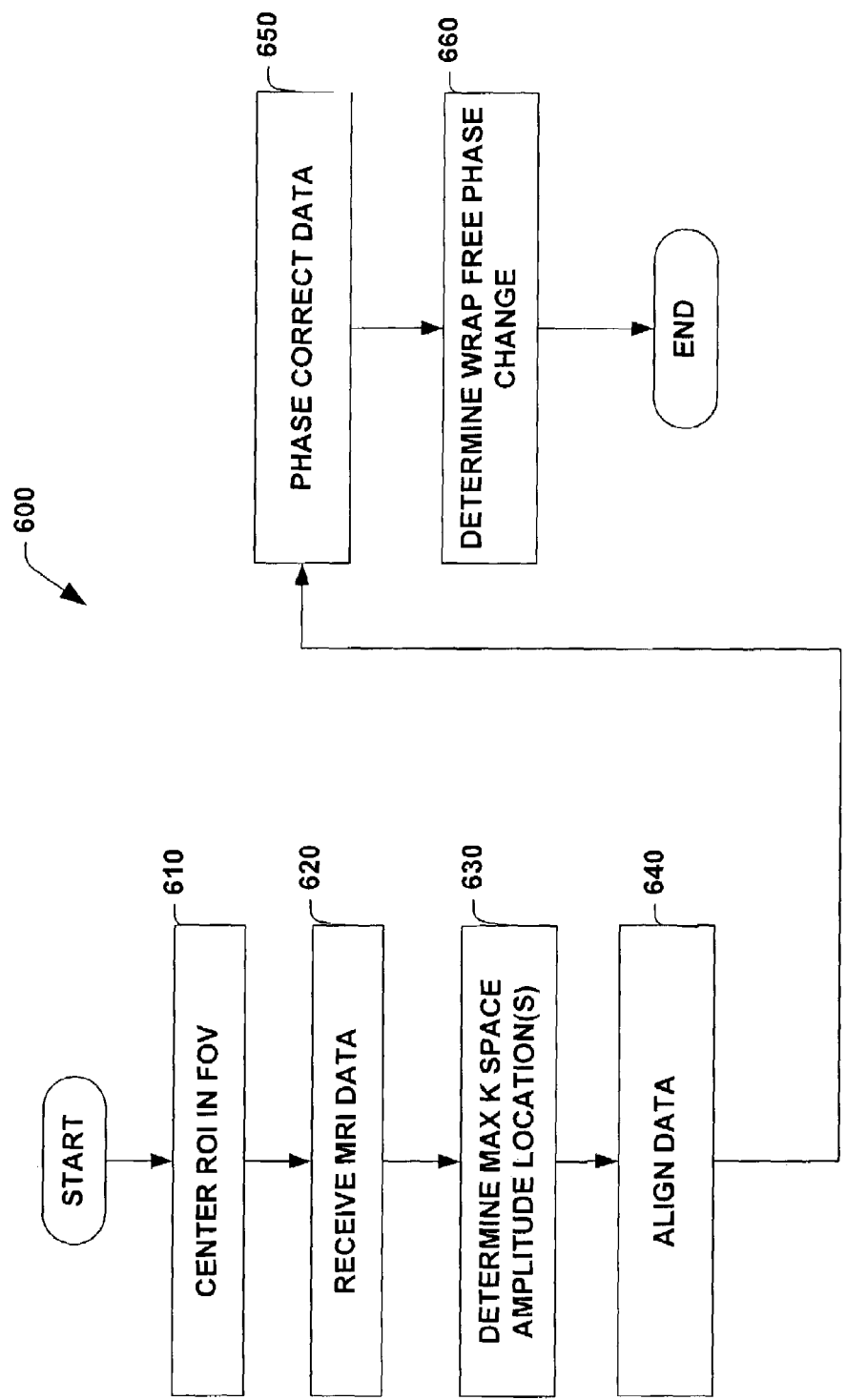
FIG. 6 is a flow chart of an example method for mitigating the effects of undesired phase shifting events.
Figure 7:
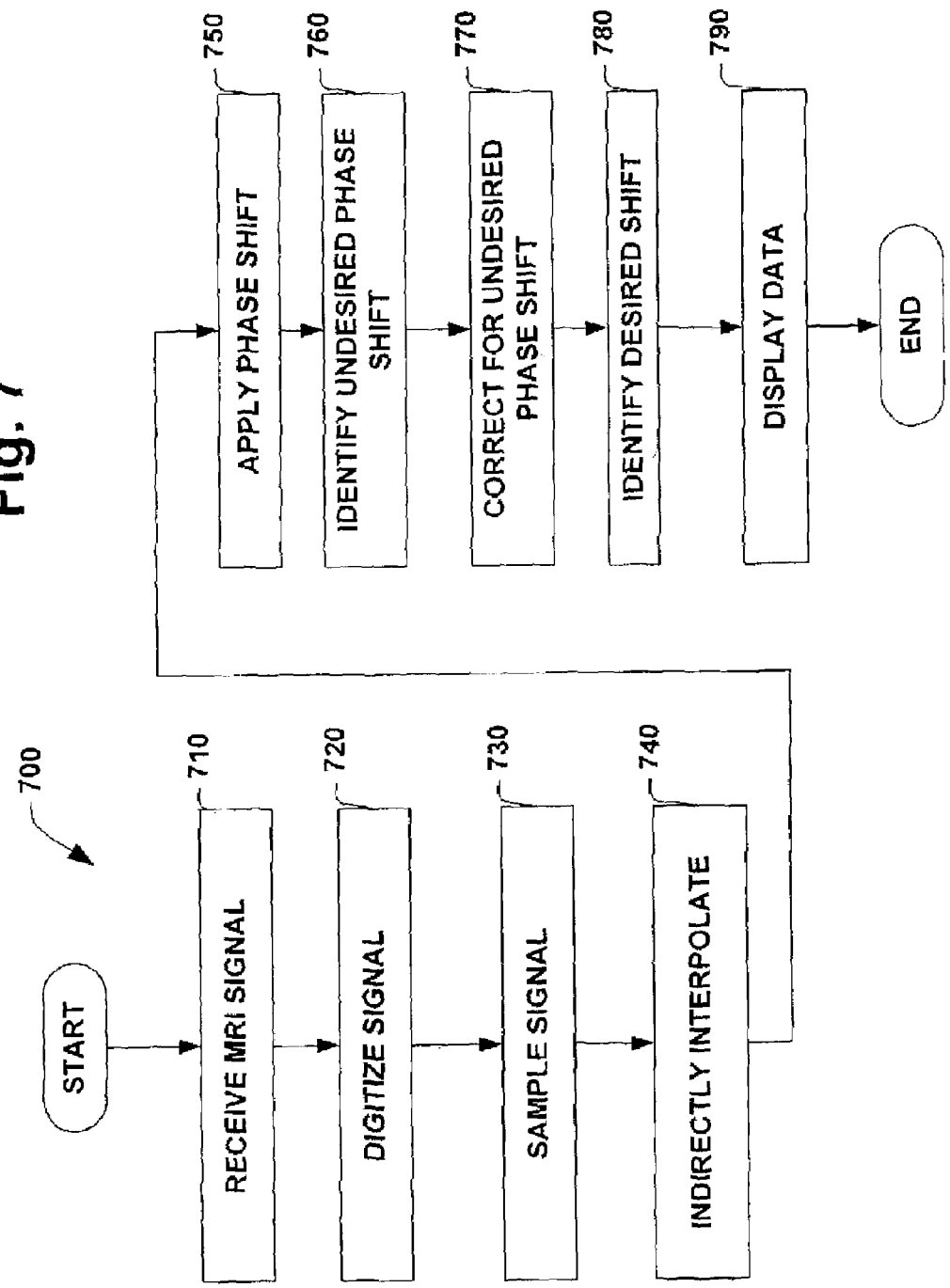
FIG. 7 is a flow chart of an example method for PRF shift thermometry.

In view of the exemplary systems shown and described herein, example computer implemented methodologies will be better appreciated with reference to the flow diagrams of FIGS. 6 and 7. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Furthermore, additional and/or alternative methodologies can employ additional, not illustrated blocks. In one example, methodologies are implemented as computer executable instructions and/or operations stored on computer readable media including, but not limited to an ASIC, a compact disc (CD), a digital versatile disk (DVD), a random access memory (RAM), a read only memory (ROM), a programmable read only memory (PROM), an electronically erasable programmable read only memory (EEPROM), a disk, a carrier wave, and a memory stick. It is to be appreciated that the methodologies can be implemented in software as that term is defined herein.

In the flow diagrams, rectangular blocks denote "processing blocks" that may be implemented, for example, in software. Similarly, the diamond shaped blocks denote "decision blocks" or "flow control blocks" that may also be implemented, for example, in software. Alternatively, and/or additionally, the processing and decision blocks can be implemented in functionally equivalent circuits like a digital signal processor (DSP), an ASIC, and the like.

A flow diagram does not depict syntax for any particular programming language, methodology, or style (e.g., procedural, object-oriented). Rather, a flow diagram illustrates functional information one skilled in the art may employ to program software, design circuits, and so on. It is to be appreciated that in some examples, program elements like temporary variables, routine loops, and so on are not shown.

FIG. 6 illustrates an example method 600 for processing PRF shift data. The method includes, at 610, centering a point of interest of an object to be imaged in a field of view. The method 600 also includes, at 620, receiving MRI data. The MRI data can include a first MRI data from an object to be imaged that is acquired before the object is subjected to desired phase shifting events (e.g., heating) and potentially undesired phase shifting events (e.g., $B_0$ variation). The MRI data can also include one or more second MRI data of the object received after and/or while the object has been subjected to one or more proton resonance frequency altering actions.

At 630, the method 600 determines a maximum k-space amplitude location in the second MRI data. Determining the maximum k-space amplitude location can include, in one example, iteratively bisecting a given search space about an initial guess where linear phase offsets in the image domain are employed to selectively interpolate midpoints between known k-space amplitudes. See, for example, the method described in connection with FIG. 11.

At 640, the method includes aligning the data about the newly computed maximum k-space amplitude locations. This can include manipulating the second MRI data to align the maximum k-space amplitude locations with an assumed k-space center to within a tolerance. In one example the tolerance is about $\frac{1}{128}$th of a cycle/FOV.

At 650, the method 600 phase corrects the MRI data. In one example, phase correcting the MRI data comprises employing the phase of a high resolution image of an N×M mask of low-frequency Fourier coefficients as a phase correction map. In one example, N is less than five and M is less than five. In another example, N equals M and both are set to three. In one example, N could be equal to, greater than, or less than M, where N and M refer to the respective rows and columns of data contained within the mask. The values of N and M could range from zero to the maximum respective row and column dimensions of the image.

The method 600 also includes, at 660, determining a wrap free phase change from the reference image on an element-by-element basis. In one example, the element is a pixel that contains phasor data, or the magnitude and phase of the signal stored in that pixel. In one example, an examination of one or more relationships between the real and imaginary components of the image domain data contained within the pixel at two different times leads to the formation of wrap free phase change over the range 0 to $2\pi$. In one example, the different times correspond to an image before (e.g., reference) and an image during heating or some other desired phase shifting event.

Turning now to FIG. 7, an example method 700 for calculating temperature change in an MR image in the presence of variations like temporally and/or spatially dependent variations in $B_0$ is illustrated. The method includes, at 710, receiving an MRI signal. Once the MRI signal has been received, the method 700 accurately aligns echoes in a signal. In one example, accurately aligning echoes in a signal includes digitizing the signal at 720, sampling the signal at uniform time intervals to produce a sampled data at 730 and indirectly interpolating the sampled data to find a peak signal location at 740. It is to be appreciated that 720 through 740 can be performed serially and/or substantially in parallel, and that 720 through 740 can be performed after a sufficient amount of MRI signal has been received at 710.

The method 700 also includes, at 750, applying a phase shift to one or more sets of data encoded in the signal to align the one or more sets of data. Once the data has been aligned, then the method 700 can perform k-space based phase correction. Performing k-space based phase correction can include, at 760, identifying a phase change that is due to an undesired phase changing event (e.g., $B_0$ variation) and then manipulating the data to suppress the phase change. In the case of an overall $B_0$ variation, the phase change effect will be localized near the center of k-space and thus suppression efforts can be focused there.

At 770, the method 700 includes correcting for the undesired phase shift. This may include, for example, manipulating the data to suppress the undesired phase change. In one example, manipulating the data to suppress the undesired phase change includes creating an opposite effect of what is seen at the center of k-space. Additionally, the method 700 may include extracting wrap free phase differences on a unit by unit basis. In one example, the unit is a pixel.

At 780, the method identifies a desired shift. For example, in PRF shift thermometry, the desired shift is caused by temperature change of a local region of interest in a field of view. Thus, since the change is local, the shift due to the local change is likely to be distributed throughout the k-space. Therefore, the previous manipulation of the center of k-space is likely to leave the distributed effects of local phase change substantially intact.

Thus, one example method includes receiving a signal generated in a magnetic coil, digitizing the signal and sampling the signal at uniform time intervals. However, the sampling might not sample the location of the peak so an interpolation is performed, (e.g., an indirect interpolation), to determine the peak signal location. When the peak location is found, a frequency shift is applied to the k-space data to align the peak signal location in each of the images to a consistent location. The indirect interpolation technique facilitates selectively finding points in between the coarsely sampled points so that the algorithm rapidly converges to the peak. In one example, it uses a binary search scheme to chose which points will be interpolated.

Once the image data is aligned in k-space, one example method determines how to suppress one of $B_0$ or $\Delta T$ but not the other, leaving an image that can display the effects of the desired phase shifting event. In one example, an assumption is made that the extent of $\Delta T$ (the temperature change to determine) is relatively small relative to the field of view, and the change in $B_0$ (magnetic field) is over the entire field of view with gradual variations.

From a Fourier transform perspective, things that are small in space have their data substantially everywhere in data collection k-space. For example, little areas in the image correspond to large regions of k-space, and things that occur in large scales in the image correspond to very small regions in k-space.

With this in mind, local changes in the image (e.g., temperature change in a spot) will have an effect substantially everywhere in k-space. However, $B_0$ is changing substantially everywhere over the image, but its effect is focused about one spot in k-space (e.g. the center of k-space). Thus, if the method corrects mostly for the effect of the main magnetic field, it will only slightly affect the fidelity of the temperature data in the image. Although temperature data does exist at the center of k-space, the amount of temperature data affected is minimal when correcting for $B_0$.

Figure 8:
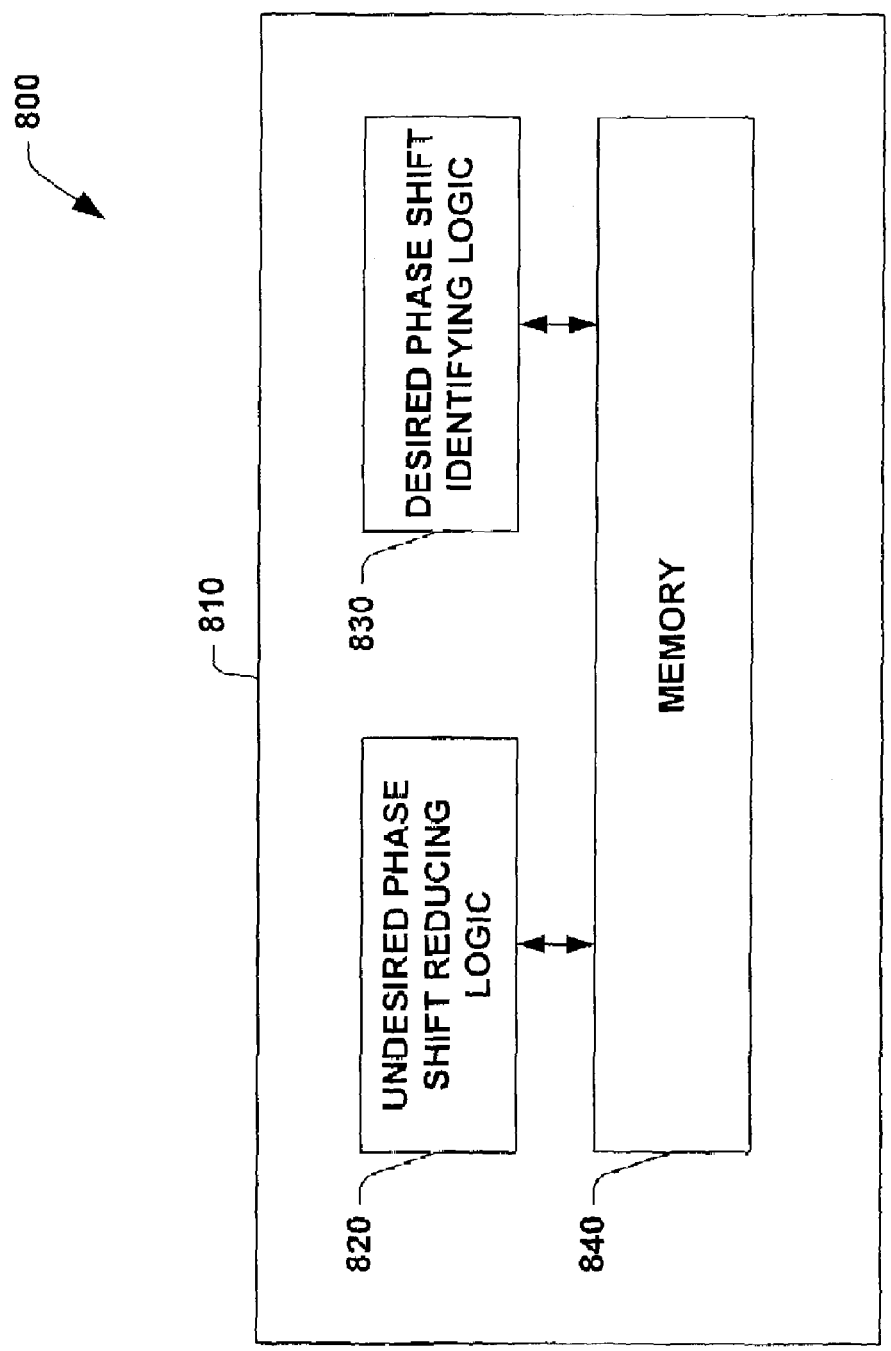
FIG. 8 illustrates an example MRI system.

FIG. 8 illustrates another example system 800 for correcting for the effects of undesired phase shifting events. The system 800 includes an MRI apparatus 810 into which have been integrated a first logic 820, a second logic 830, and a memory 840. Those skilled in the art will recognize that an MRI apparatus 810 may already have one or more logics that can be reprogrammed and/or replaced (e.g., ROMs installed). Similarly, those skilled in the art will recognize that an MRI apparatus 810 may already have a memory 840. Thus, the system 800 can, in one example, be implemented in existing MRI apparatus by reprogramming, reconfiguring, and/or installing new parts.

In one test that exercised example systems like those described herein, a phantom of Natrosol (Aqualon Co., Hopewell, Va., USA) was constructed to mimic a block of tissue. The phantom was allowed to equilibrate for 3 hours to the imaging room temperature. Raw k-space data was collected every minute for one hour on a Siemens 0.2T open imager using an echo shifted GRE sequence (TR 19.4 ms, $TE_{eff}$ 28.9 ms, $\alpha$=30°, FOV=300 mm$^2$, Matrix=128$^2$, NA=2, BW=78 Hz/pixel) (TR=relaxation time, TE=echo time). Center frequency and shim currents remained unaltered during the acquisition of 60 data sets in total. One skilled in the art will appreciate that this was but one test, and that variations in one or more settings are contemplated.

The correction process, referred to in one example as the Variation Correction Algorithm (VCA), was executed in four stages. First, the point of interest in the object was centered in the field of view (FOV). Second, the maximum k-space amplitude position was aligned with an assumed k-space center to the nearest $\frac{1}{128}$th of a cycle/FOV. This was accomplished with iterative bisection of a given search space about an initial guess, where linear phase offsets in the image domain were used to selectively interpolate midpoints between known k-space amplitudes. Third, the phase of a high-resolution image of an N×N mask of low-frequency Fourier coefficients served as the phase correction map. Then the wrap free phase change from the reference image was determined on a pixel-by-pixel basis by examining the relationships between the two phasors over the range $[0, 2\pi]$. Those skilled in the art will appreciate that the stages could be performed in other orders and that a greater number of stages could be employed.

In the example, to analyze suppression, the images were processed with a mask size of N×N (N=0, 1 . . . 8, 16, 32, 64, 128). Using image 1 as the reference, 59 phase difference images were formed. In a 35×35 region of interest (ROI) centered in the FOV, the mean and standard deviation (SD) of residual phase difference were computed. Temporal behavior of suppression errors was summarized by the mean±SD, and maximum(max) and minimum(min) of all 59 estimators for each measure and choice of N. A different number of images and estimators could also be used.

In the example, to analyze profile fidelity, a simulated Gaussian-shaped profile ($\Delta T$max=53° C., radius=15 pixels, $\sigma$=4.38 pixels) was applied in the center of the object prior to the example VCA processing described above. The applied thermal profile was subtracted from the temperature difference to yield a profile error map. For each image, the mean, SD, max and min error along the $\Delta T$=23° C. contour (60° C. line) was determined for each N. The temporal behavior (mean, SD, max, min) of each profile fidelity estimator was extracted. In addition, profile distortions were noted.

Useful suppression performance was achieved at several values for N, with one example being N=3. At N=3, the typical mean residual error was: (mean, SD, max, min)=(−0.1° C., 0.3° C., 0.6° C., −1.2° C.); and the typical SD of residual error was: (mean, SD, max, min)=(3.5° C., 0.5° C., 4.5° C., 2.1° C.).

Figure 9:
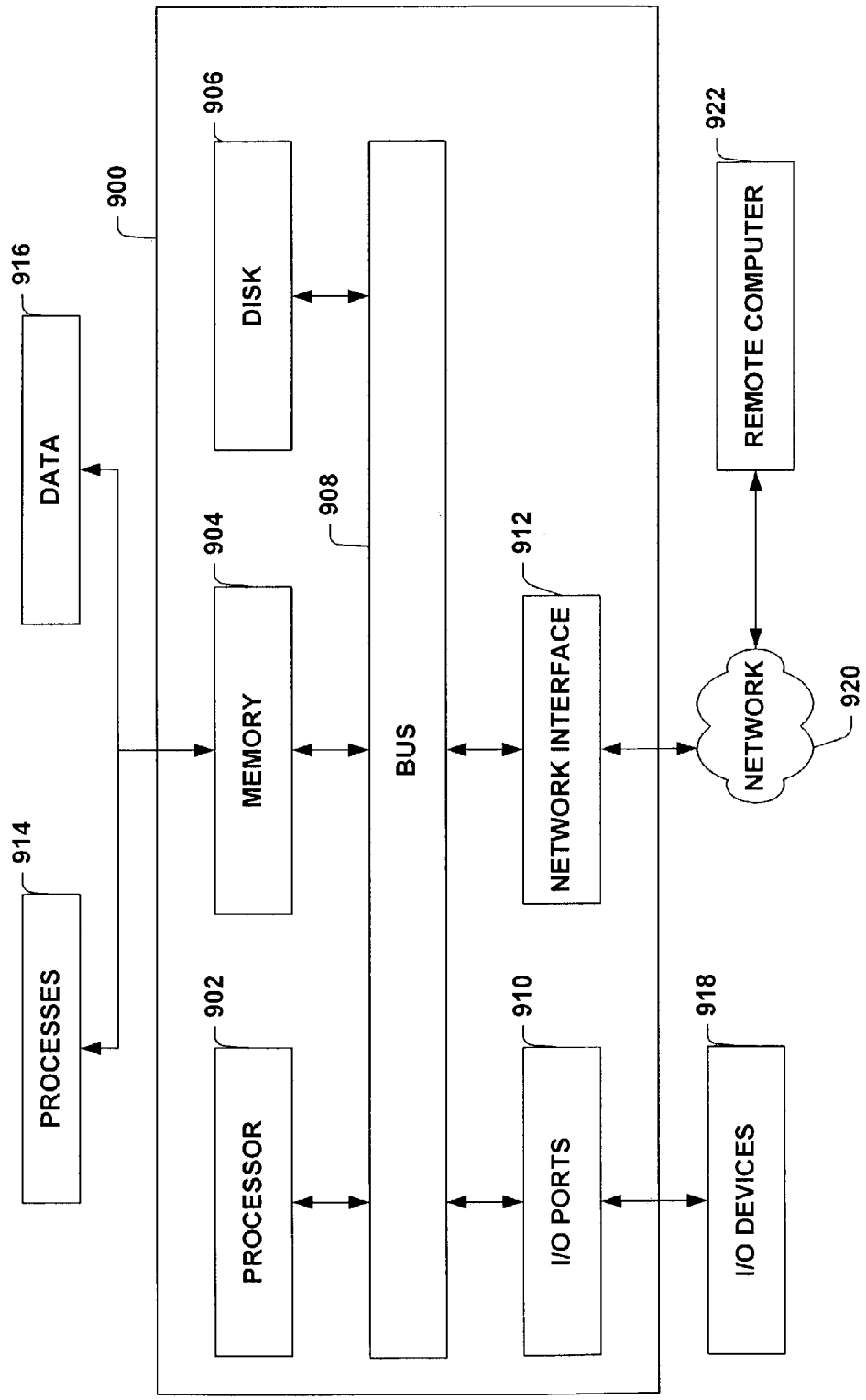
FIG. 9 illustrates an example computing environment with which computer executable systems and methods can interact.

FIG. 9 illustrates a computer 900 that includes a processor 902, a memory 904, a disk 906, input/output ports 910, and a network interface 912 operably connected by a bus 908. Executable components of the systems described herein may be located on a computer like computer 900. Similarly, computer executable methods described herein may be performed on a computer like computer 900. It is to be appreciated that other computers and/or computer components may also be employed with the systems and methods described herein. Furthermore, it is to be appreciated that the computer 900 can be located locally to an MRI system, remotely to an MRI system, and/or can be embedded in an MRI system.

The processor 902 can be a variety of various processors including dual microprocessor and other multi-processor architectures. The memory 904 can include volatile memory and/or non-volatile memory. The non-volatile memory can include, but is not limited to, read only memory (ROM), programmable read only memory (PROM), electrically programmable read only memory (EPROM), electrically erasable programmable read only memory (EEPROM), and the like. Volatile memory can include, for example, random access memory (RAM), synchronous RAM (SRAM), dynamic RAM (DRAM), synchronous DRAM (SDRAM), double data rate SDRAM (DDR SDRAM), and direct RAM bus RAM (DRRAM). The disk 906 can include, but is not limited to, devices like a magnetic disk drive, a floppy disk drive, a tape drive, a Zip drive, a flash memory card, and/or a memory stick. Furthermore, the disk 906 can include optical drives like, a compact disk ROM (CD-ROM), a CD recordable drive (CD-R drive), a CD rewriteable drive (CD-RW drive) and/or a digital versatile ROM drive (DVD ROM). The memory 904 can store processes 914 and/or data 916, for example. The disk 906 and/or memory 904 can store an operating system that controls and allocates resources of the computer 900.

The bus 908 can be a single internal bus interconnect architecture and/or other bus architectures. The bus 908 can be of a variety of types including, but not limited to, a memory bus or memory controller, a peripheral bus or external bus, and/or a local bus. The local bus can be of varieties including, but not limited to, an industrial standard architecture (ISA) bus, a microchannel architecture (MSA) bus, an extended ISA (EISA) bus, a peripheral component interconnect (PCI) bus, a universal serial bus (USB), and a small computer systems interface (SCSI) bus.

The computer 900 interacts with input/output devices 918 via input/output ports 910. Input/output devices 918 can include, but are not limited to, a keyboard, a microphone, a pointing and selection device, cameras, video cards, displays, and the like. The input/output ports 910 can include but are not limited to, serial ports, parallel ports, and USB ports.

The computer 900 can operate in a network environment and thus is connected to a network 920 by a network interface 912. Through the network 920, the computer 900 may be logically connected to a remote computer 922. The network 920 includes, but is not limited to, local area networks (LAN), wide area networks (WAN), and other networks. The network interface 912 can connect to local area network technologies including, but not limited to, fiber distributed data interface (FDDI), copper distributed data interface (CDDI), ethernet/IEEE 802.3, token ring/IEEE 802.5, and the like. Similarly, the network interface 912 can connect to wide area network technologies including, but not limited to, point to point links, and circuit switching networks like integrated services digital networks (ISDN), packet switching networks, and digital subscriber lines (DSL).

Figure 10:
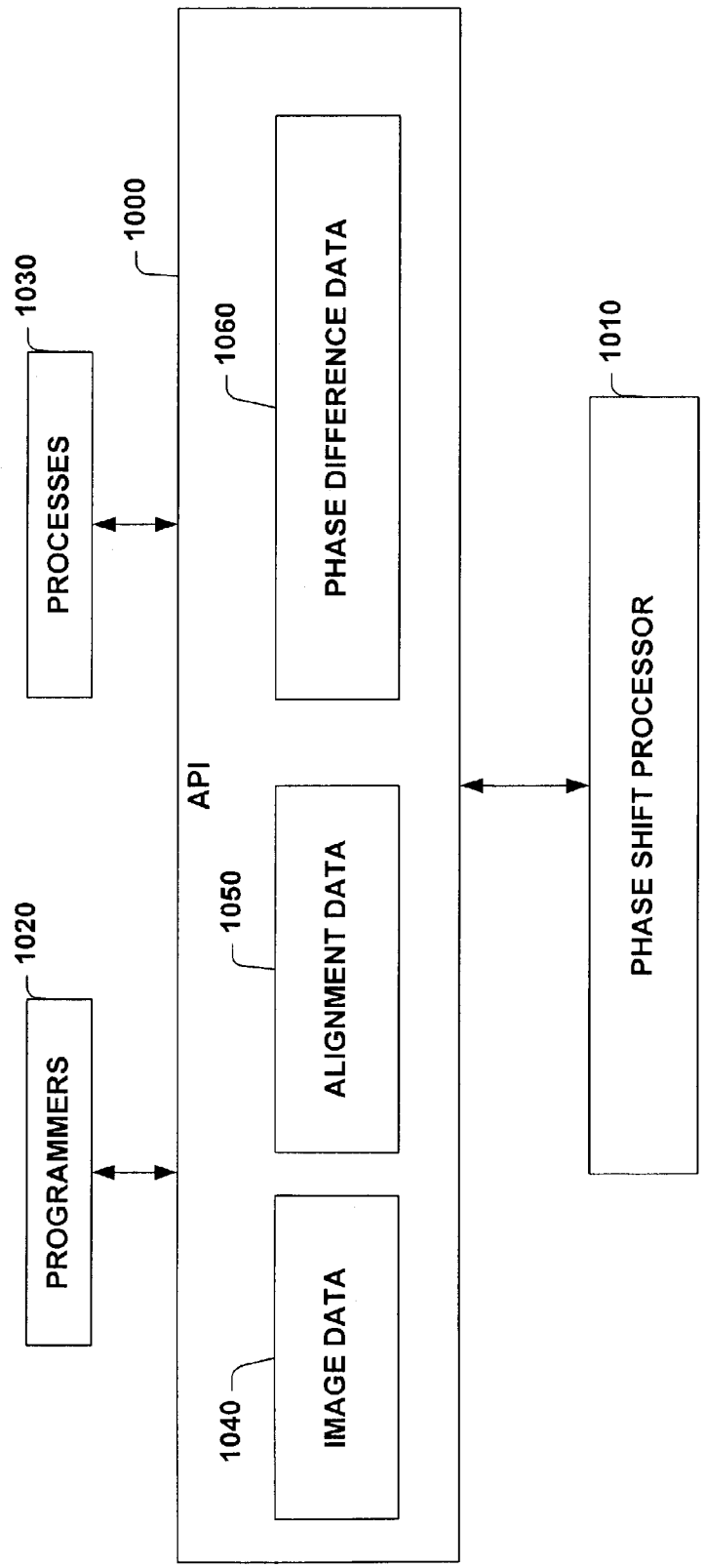
FIG. 10 illustrates an example API associated with PRF shift imaging.

Referring now to FIG. 10, an application programming interface (API) 1000 is illustrated providing access to a system 1010 that includes a phase shift processor. The phase shift processor 1010 facilitates distinguishing and manipulating PRF shift related data. The API 1000 can be employed, for example, by programmers 1020 and/or processes 1030 to gain access to processing performed by the system 1010. For example, a programmer 1020 can write a program to access (e.g., to invoke its operation, to monitor its operation, to access its functionality) the system 1010 where writing the program is facilitated by the presence of the API 1000. Rather than the programmer 1020 having to understand the internals of the system 1010, the programmer's task is simplified by merely having to learn the interface 1000 to the system 1010. This facilitates encapsulating the functionality of the system 1010 while exposing that functionality. Similarly, the API 1000 can be employed to provide data values to the system 1010 and/or to retrieve data values from the system 1010.

For example, a programmer 1020 may wish to present image data to the system 1010 and thus the programmer 1020 may employ an image data interface 1040 component of the API 1000. Similarly, the programmer 1020 may wish to present an alignment data to the system 1010 and thus may employ an alignment data interface 1050 component of the API 1000. After receiving the image data and alignment data, the system 1010 may, for example, pass a phase difference data to a process 1030 via a phase difference data interface 1060 component of the API 1000.

Thus, in one example of the API 1000, a set of application program interfaces can be stored on a computer-readable medium. The interfaces can be executed by a computer component to gain access to a system for processing PRF phase shift data. Interfaces can include, but are not limited to, a first interface that facilitates communicating an image data associated with one or more MRI signals, a second interface that facilitates communicating an alignment data, and a third interface that facilitates communicating a phase difference data generated from the image data and the alignment data.

Concerning indirect interpolation, the following discussion concerning FIG. 11 facilitates understanding one example method. To find the maximum amplitude position in two dimensional K-space to sub-sample resolution for accurate echo alignment, some form of interpolation is be performed to increase the numerical resolution of K-space. By Fourier transform properties that are known in the art, the two dimensional Fast Fourier Transform of a zero-padded matrix of object pixel data will yield a sinc interpolated K-space with increased numerical resolution. Given finite memory and computational resources and desired numerical resolution, the factor to which a matrix of data can be zero-padded is limited.

The shift properties of the Fourier transform, namely linear phase variations applied in one domain (e.g., in the image) cause position shifts in the other domain (e.g., K-space), and thus can be used to selectively query the data that lies between coarsely spaced samples in K-space. It is apparent to those in the art that the phase shift could be applied in K-space to interpolate between pixels of the image. In essence, small (e.g., $\frac{1}{128}^{th}$ of a cycle of $2\pi$ across the field of view) increments of the global linear phase terms of the image will slightly shift K-space so that unknown data at known position offsets from a coarsely spaced sample will appear to have been sampled. Since the applied position shift is known, the value of the previously unknown data can be determined and then remapped to its original offset from the coarsely sampled signal.

Selectively interpolating between adjacent pixels in one Fourier domain by applying linear phase variations in the complementary Fourier domain is called Indirect Interpolation.

However, all possible combinations of phase shifts need not be tested to determine the maximum interpolated amplitude position. If K-space is assumed to monotonically decrease in the neighborhood of the maximum amplitude, binary search methods can control the Indirect Interpolation between the elements of a coarsely sampled signal. The following two conditions are assumed to be true for any arbitrary data set:

The maximum amplitude lies within a finite neighborhood about some initial guess in K-space; and, The location of maximum amplitude should be found to the nearest $(1/2)^{Af}$ of a sample.

FIG. 11 summarizes the three steps of the alignment process that are repeated until the desired sub-sample resolution is obtained for a neighborhood of ±1 sample and alignment tolerance of $1/128^{th}$ of a sample (e.g., Af=7).

1110 illustrates initializing a matrix of known amplitudes. The amplitude of the initial guess is placed in the center of a 5×5 matrix of zeros; typically, the initial estimate is the peak signal in the raw data matrix. The amplitudes that fall ±1 sample along the Kx and Ky directions from that guess are placed along the edge of the matrix at corresponding positions. This defines the extent of the initial search space for the first iteration (iter=1) of interpolation.

1120 illustrates querying and recording unknown amplitudes. The midpoint between any two adjacent known amplitudes in 1110 corresponds to an unknown datum that exists $(1/2)^{iter}$ row and/or column away. Indirect Interpolation is applied sixteen times (e.g., 9 of 25 amplitudes are already known) to "bisect" any interval between known amplitudes.

1130 illustrates preparing the matrices for another round of interpolation. Since monotonicity was assumed, a search space that extends±$(1/2)^{iter}$ row and/or column from the current maximum amplitude is the smallest space that still contains the unique maximum amplitude. Hence, the current maximum amplitude (shaded with vertical bars in 1120) is placed in the center of a 5×5 matrix of zeros, and the values that are ±1 element (e.g., ±½ sample from the position of the current maximum for iter=1) away in the recently filled amplitude matrix are arranged in their corresponding positions along the edges as per 1130. If the current maximum amplitude falls on an edge of the filled matrix, an additional set of Indirect Interpolations is performed to capture the necessary data that is not in the current amplitude matrix. All other search regions, as demonstrated by the shaded overlay in 1130, are discarded as they cannot contain the global maximum amplitude and need not be tested further.

Iterations of the "Query" and "Prepare" stages more finely resamples the search space about the current maximum amplitude by a factor of two in both the Kx and Ky directions until the algorithm converges to the unique maximum interpolated amplitude contained within the search space. In other words, uncertainty in the position of maximum amplitude decreases from ±1, to ±½, to ±¼ to . . . ±$(1/2)^{Af}$ of a sample with each iteration. Similarly, iterations of the search algorithm can be said to reduce the search space by a factor of four. At convergence, the corresponding Kx and Ky frequency offset is the scaled amount of linear phase in the image domain that will shift the peak amplitude to the location of the original peak signal estimate. Thus, two sets of scaled amounts of linear phase are applied simultaneously to align the data. One set shifts the maximum interpolated amplitude to the location of the original peak estimate, and the other set corresponds to integer cycles of linear phase that will shift the data from the original peak location to the center of K-space.

Those skilled in the art will appreciate that FIG. 11 illustrates one example, and that other methods can be employed. This echo alignment process (Indirect Interpolation under the control of binary search principles) can be extended to cases where: the size of the initial search space could be larger than ±1 sample; the initial guess could be a signal feature other than the position of the maximum amplitude in the coarsely sampled signal; the location of some other signal characteristic maximum (e.g., phase, power) is the search objective; the search tolerance is greater or less than $1/128^{th}$ of a sample; data other than signal amplitude is queried and recorded; data is retained through all iterations; data is represented by more than two dimensions; and so on.

The systems, methods, and objects described herein may be stored, for example, on a computer readable media. Media can include, but are not limited to, an ASIC, a CD, a DVD, a RAM, a ROM, a PROM, a disk, a carrier wave, a memory stick, and the like. Thus, an example computer readable medium can store computer executable instructions for computer implemented methods described and claimed herein. Similarly, a computer readable medium can store computer executable components of systems described and claimed herein.

What has been described above includes several examples. It is, of course, not possible to describe every conceivable combination of components or methodologies for purposes of describing the methods, systems, computer readable media and so on employed in PRF shift thermometry in an MRI system. However, one of ordinary skill in the art may recognize that further combinations and permutations are possible. Accordingly, this application is intended to embrace alterations, modifications, and variations that fall within the scope of the appended claims. Furthermore, to the extent that the term "includes" is employed in the detailed description or the claims, it is intended to be inclusive in a manner similar to the term "comprising" as that term is interpreted when employed as a transitional word in a claim. Further still, to the extent that the term "or" is employed in the claims (e.g., A or B) it is intended to mean "A or B or both". When the author intends to indicate "only A or B but not both", then the author will employ the term "A or B but not both". Thus, use of the term "or" herein is the inclusive, and not the exclusive, use. See BRYAN A. GARNER, A DICTIONARY OF MODERN LEGAL USAGE 624 (2d Ed. 1995).

What is claimed is:

1. A method, comprising:

centering a point of interest of an object to be imaged in a field of view;

receiving a first MRI data of the object;

establishing a reference image from the first MRI data;

receiving one or more second MRI data of the object, where the object has been subjected to one or more proton resonance frequency altering actions;

determining a maximum k-space amplitude location in one or more of the second MRI data;

manipulating the first MRI data to align the maximum k-space amplitude locations with an assumed k-space center to within a tolerance;

phase correcting the first MRI data;

determining a wrap free phase change from the reference image on an element-by-element basis; and producing a display data that can be displayed, where the display data facilitates displaying the results of a desired phase shift event on the object to be imaged.

2. The method of claim 1, where determining a maximum k-space amplitude location comprises iteratively bisecting a given search space about an initial guess where one or more linear phase offsets in an image domain are employed to selectively interpolate midpoints between one or more known k-space amplitudes.

3. The method of claim 1, where phase correcting the first MRI data comprises employing the phase of a low resolution image of an N×M mask of low-frequency Fourier co-efficients as a phase correction map, where N and M refer to the respective number of rows and columns of data contained within the mask, M and N being integers.

4. A method, comprising:
centering a point of interest of an object to be imaged in a field of view;
receiving a first MRI data of the object;
establishing a reference image from the first MRI data;
receiving one or more second MRI data of the object, where the object has been subjected to one or more proton resonance frequency altering actions;
determining a maximum k-space amplitude location in one or more of the second MRI data;
manipulating the first MRI data to align the maximum k-space amplitude locations with an assumed k-space center to within a tolerance;
phase correcting the first MRI data;
determining a wrap free phase change from the reference image on an element-by-element basis; and
producing a display data that can be displayed, where the display data facilitates displaying the results of a desired phase shift event on the object to be imaged,
where phase correcting the first MRI data comprises employing the phase of a low resolution image of an N×M mask of low-frequency Fourier co-efficients as a phase correction map, where N and M refer to the respective number of rows and columns of data contained within the mask, M and N being integers, and where N is less than 5 and where M is less than 5.

5. The method of claim 3, where N and M are related to one or more of the FOV and the size of the expected site of phase variation.

6. A method, comprising:
centering a point of interest of an object to be imaged in a field of view;
receiving a first MRI data of the object;
establishing a reference image from the first MRI data;
receiving one or more second MRI data of the object, where the object has been subjected to one or more proton resonance frequency altering actions;
determining a maximum k-space amplitude location in one or more of the second MRI data;
manipulating the first MRI data to align the maximum k-space amplitude locations with an assumed k-space center to within a tolerance;
phase correcting the first MRI data;
determining a wrap free phase change from the reference image on an element-by-element basis; and
producing a display data that can be displayed, where the display data facilitates displaying the results of a desired phase shift event on the object to be imaged,
where the tolerance is about $1/128$th of a cycle/FOV.

7. A method, comprising:
centering a point of interest of an object to be imaged in a field of view;
receiving a first MRI data of the object;
establishing a reference image from the first MRI data;
receiving one or more second MRI data of the object, where the object has been subjected to one or more proton resonance frequency altering actions;
determining a maximum k-space amplitude location in one or more of the second MRI data;
manipulating the first MRI data to align the maximum k-space amplitude locations with an assumed k-space center to within a tolerance;
phase correcting the first MRI data;
determining a wrap free phase change from the reference image on an element-by-element basis; and
producing a display data that can be displayed, where the display data facilitates displaying the results of a desired phase shift event on the object to be imaged,
where determining the wrap free phase change comprises examining one or more relationships between two phasors over the range 0 to $2\pi$.

8. The method of claim 1, where the element is a pixel.

* * * * *

UNITED STATES PATENT AND TRADEMARK OFFICE
CERTIFICATE OF CORRECTION

| | | |
|---|---|---|
| PATENT NO. | : 7,359,745 B2 | Page 1 of 1 |
| APPLICATION NO. | : 10/437662 | |
| DATED | : April 15, 2008 | |
| INVENTOR(S) | : Lewin et al. | |

It is certified that error appears in the above-identified patent and that said Letters Patent is hereby corrected as shown below:

On the Title Page, Item (57)

line 4, "MR!" should read --MRI--

Signed and Sealed this

Eighth Day of July, 2008

JON W. DUDAS
*Director of the United States Patent and Trademark Office*